United States Patent
Arai et al.

(10) Patent No.: US 6,231,997 B1
(45) Date of Patent: May 15, 2001

(54) SEMICONDUCTOR ENCAPSULATING EPOXY RESIN COMPOSITIONS, AND SEMICONDUCTOR DEVICES

(75) Inventors: Kazuhiro Arai; Kazutoshi Tomiyoshi; Toshio Shiobara, all of Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/358,481

(22) Filed: Jul. 21, 1999

(30) Foreign Application Priority Data

Jul. 21, 1998 (JP) .................................. 10-221074

(51) Int. Cl.⁷ .................................................. H01L 29/12
(52) U.S. Cl. ........................................... 428/620; 523/466
(58) Field of Search .............................. 523/466; 428/620

(56) References Cited

U.S. PATENT DOCUMENTS

| | | | |
|---|---|---|---|
| 5,190,995 | * 3/1993 | Shiobara et al. | 523/433 |
| 5,476,884 | * 12/1995 | Kayaba et al. | 523/443 |
| 5,827,908 | * 10/1998 | Arai et al. | 523/212 |

FOREIGN PATENT DOCUMENTS

| | | | |
|---|---|---|---|
| 739877 | * 10/1996 | (EP) | . |
| 03195722 | * 8/1991 | (JP) | . |
| 8259666 | 10/1996 | (JP) | . |

OTHER PUBLICATIONS

Virginia F. Wells, Semiconductor International May 1989 pp. 214–218.
Nikkei Microdevices, Jul. 1987 pp. 67–67 (Japanese language).

* cited by examiner

Primary Examiner—Robert Dawson
Assistant Examiner—D. Aylward

(57) ABSTRACT

Epoxy resin compositions comprising (A) a crystalline epoxy resin, (B) a polyfunctional phenolic resin, (C) an organic phosphorus curing accelerator, (D) an aminosilane coupling agent, and (E) at least 88 wt % based on the composition of an inorganic filler are smoothly flowing, fast curing and shelf stable. Due to minimized package warp, minimized wire flow, improved adhesion, and low water absorption, the compositions enable highly reliable encapsulation of semiconductor devices, especially BGA.

10 Claims, No Drawings

SEMICONDUCTOR ENCAPSULATING EPOXY RESIN COMPOSITIONS, AND SEMICONDUCTOR DEVICES

This invention relates to epoxy resin compositions for semiconductor encapsulation and more particularly, to epoxy resin compositions suited for the encapsulation of ball grid array (BGA) packages because of minimized package warp, minimized wire flow and good adhesion. It relates also to semiconductor devices encapsulated with the compositions in a cured state.

BACKGROUND OF THE INVENTION

Resin-encapsulated devices currently predominate in the semiconductor industry. Epoxy resins are generally superior to other thermosetting resins in terms of moldability, adhesion, electrical characteristics, mechanical characteristics, and moisture resistance. Epoxy resin compositions are commonly used for the encapsulation of semiconductor devices.

Ball grid array (BGA) packages, developed fairly recently by Motorola, have a distinctive structure in which the chip is mounted directly onto the circuit board substrate, and the top of the chip is encapsulated in plastic. In BGA packages, only one side of the substrate is resin encapsulated. Hence, the difference in shrinkage factor between the substrate and the resin leads to warping of the package, which is a major problem.

A number of attempts have been made to overcome this problem by increasing the glass transition temperature (Tg) and lowering the thermal expansion coefficient of the resin so as to reduce the difference in shrinkage between the substrate and the resin, and thus minimize package warp. One specific solution involves using a polyfunctional epoxy resin, a polyfunctional phenolic resin as the curing agent, and an imidazole compound as the curing accelerator in order to increase the glass transition temperature, and including also a large quantity of silica filler to lower thermal expansion. In order to enable high loading of silica filler while maintaining good flow characteristics, it is known to use all spherical silica particles free of fragments so as to optimize the particle size distribution of the filler. A method of treating silica with a coupling agent to optimize its surface state is also known. Another important property when evaluating device reliability is the adhesion of the resin to the solder mask covering the substrate surface. It is well known in the art that adhesion of the resin to the solder mask can be dramatically enhanced by the judicious selection of an epoxysilane or mercaptosilane coupling agent.

Yet, the prior art described above was found to have a number of serious drawbacks. For instance, the use of an epoxy resin and a phenolic resin both of the polyfunctional type results in a cured product having an increased water absorption because of an increased free volume within the molecular structure. As a result, the cured product becomes low in soldering heat resistance after moisture absorption and susceptible to popcorn cracks. Also, all non-crystalline epoxy resins including polyfunctional ones have a relatively high viscosity. When an epoxy resin composition is loaded with a large quantity of an inorganic filler such as silica, the composition has an increased melt viscosity which when a BGA package is encapsulated therewith, causes molding defects such as wire flow and breakage. Additionally, epoxy resin compositions using an imidazole compound as the curing accelerator have a shelf stability inferior to that of compositions using a phosphorus-containing accelerator, so that wire flow and incomplete filling due to a rapid rise in viscosity in the resin encapsulation step are more likely to arise unless the resin encapsulating step is strictly managed. In addition, hydrolyzable chlorine within the epoxy resin is more readily extracted, which can be detrimental to device reliability in the presence of moisture. Furthermore, the steady increase in package size within the industry requires that further reductions be made in thermal expansion, but the high loadings of silica currently in use increase the viscosity of the composition, resulting in frequent wire flow. A certain type of coupling agent slows the curing speed of the epoxy resin composition at the time of resin encapsulation, which can lead to an increase in package warp.

Effective solutions have not previously been found to these and other problems associated with prior-art resin compositions for BGA encapsulation.

SUMMARY OF THE INVENTION

An object of the invention is to provide a semiconductor-encapsulating epoxy resin composition which has improved working efficiency and reliability upon encapsulation of semiconductor devices because of minimized package warp, minimized wire flow, good adhesion to a solder mask, and shelf stability. Another object of the invention is to provide a semiconductor device encapsulated with the composition in a cured state.

The inventor has found that by combining (A) a crystalline epoxy resin, (B) a polyfunctional phenolic resin, (C) an organic phosphorus curing accelerator, and (D) an aminosilane coupling agent, and blending (E) a large amount of an inorganic filler therein, there is obtained a semiconductor-encapsulating epoxy resin composition featuring minimized package warp, improved adhesion, cured product's low water absorption, minimized wire flow, and storage stability, and enabling highly reliable encapsulation of semiconductor devices, especially BGA.

Specifically, the invention provides a semiconductor-encapsulating epoxy resin composition comprising as essential components, (A) a crystalline epoxy resin, (B) a polyfunctional phenolic resin, (C) an organic phosphorus curing accelerator, (D) an aminosilane coupling agent, and (E) an inorganic filler. The inorganic filler (E) is at least 88% by weight based on the composition. The polyfunctional phenolic resin (B) is of the following general formula (1):

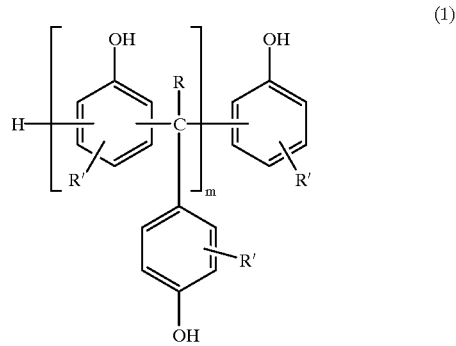

wherein R is hydrogen, methyl or ethyl, R' is hydrogen or an alkyl group having 1 to 4 carbon atoms, and m is an integer of 1 to 4.

DETAILED DESCRIPTION OF THE INVENTION

The epoxy resin used herein is a crystalline epoxy resin. It is preferably selected from epoxy resins having the molecular structure represented by the following general formulae (2), (3), (4) and (5). These epoxy resins have a high melting point (or softening point) of at least 100° C. so that they maintain a robust crystal structure until the temperature reaches the melting point (or softening point). Once the melting point (or softening point) is reached, they quickly melt into a very low viscosity liquid. This attribute allows the epoxy resin composition to be loaded with a large amount of inorganic filler, which enables to reduce the expansion coefficient of a cured product thereof.

Also useful as the crystalline epoxy resin (A) is a mixture of at least two of the epoxy resins of formulae (2) to (5) wherein n is an integer of 0 to 4, in any desired ratio.

In the practice of the invention, another epoxy resin may be used in combination with the crystalline epoxy resin insofar as the objects of the invention are not impaired. Examples of the other epoxy resins include bisphenol A type epoxy resins, novolac type epoxy resins such as phenol novolac epoxy resins and cresol novolac epoxy resins, triphenolalkane type epoxy resins such as triphenolmethane

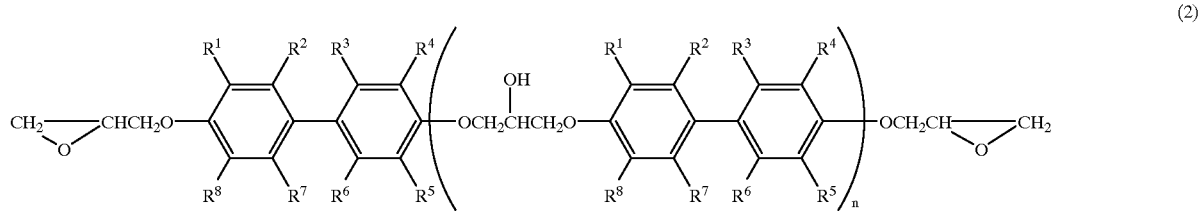

(2)

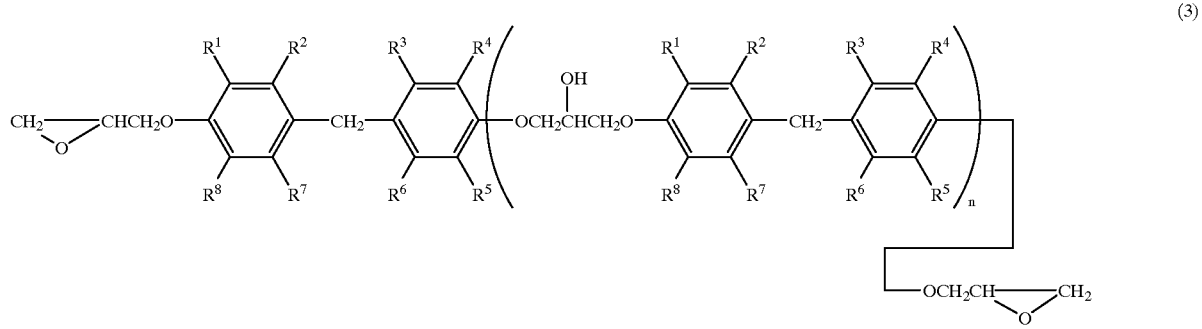

(3)

(4)

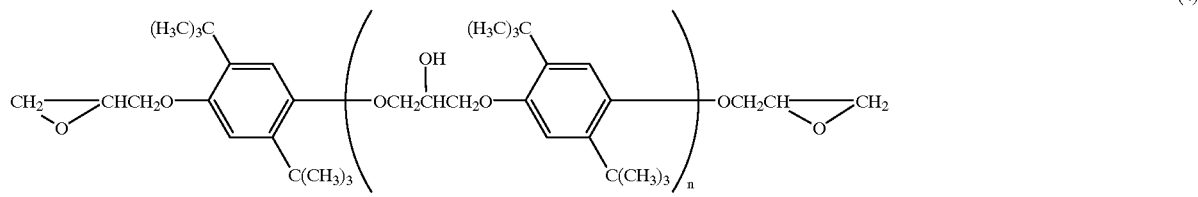

In formulae (2) to (4), $R^1$ to $R^8$ are independently selected from among hydrogen and alkyl groups of 1 to 4 carbon atoms, and n is an integer of 0 to 4.

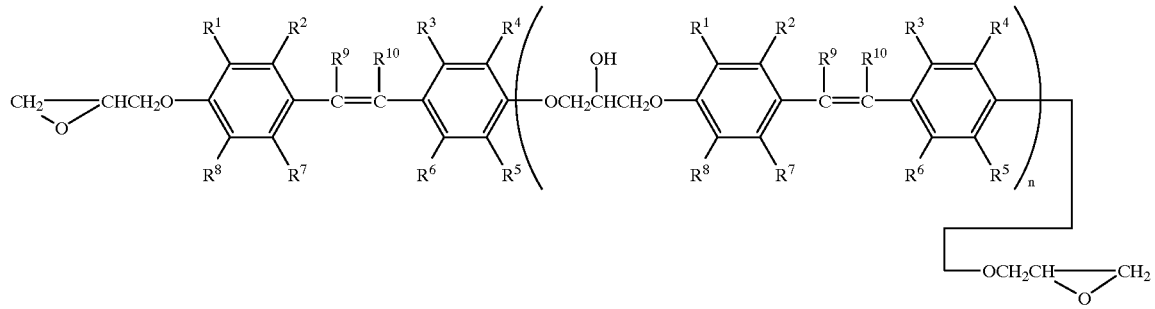

(5)

In formula (5), $R^1$ to $R^{10}$ are independently selected from among hydrogen and alkyl groups of 1 to 6 carbon atoms, and n is an integer of 0 to 4.

The alkyl groups may be straight, branched or cyclic and include, for example, methyl, ethyl, propyl, isopropyl, butyl, isobutyl, tert-butyl, pentyl, neopentyl, hexyl, and cyclohexyl. The letter n is an integer of 0 to 4, preferably equal to 0 or 1.

epoxy resins and triphenolpropane epoxy resins, naphthalene ring-containing epoxy resins, phenolaralkyl type epoxy resins, alicyclic type epoxy resins, and dicyclopentadiene type epoxy resins. In this embodiment, the crystalline epoxy resin should preferably account for at least 50% by weight (i.e., 50 to 100% by weight) and more preferably 75 to 95% by weight of the entire epoxy resins.

Component (B) is a polyfunctional phenolic resin of the following general formula (1) which serves as a curing agent for the epoxy resin.

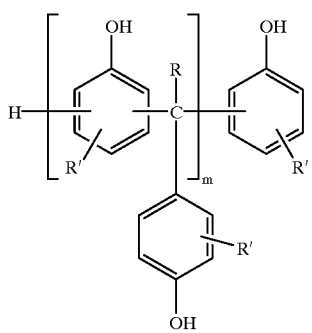

(1)

In formula (1), R is hydrogen, methyl or ethyl, R' is hydrogen or an alkyl group having 1 to 4 carbon atoms, and m is an integer of 1 to 4.

The polyfunctional phenolic resin of formula (1) is characterized by a high glass transition temperature (Tg) due to restrained molecular motion. Because the BGA package is quite likely to warp due to its one side resin encapsulation structure that a circuit board in the form of a glass fiber laminate board is impregnated with an organic resin such as BT resin, known as a bimetal structure, the resin must be selected so as to reduce the warpage. While the BGA package requires a more number of longer gold wires because of its structure, conventional encapsulants cause the gold wires to flow away, resulting in a loss of reliability. The warpage may be reduced by encapsulating with a resin composition having a shrinkage factor close to that of the substrate, that is, having a Tg and expansion coefficient close to those of the substrate. Therefore, an epoxy resin composition having a high Tg is desirable. In this regard, the polyfunctional phenolic resin of formula (1) is best suited.

In formula (1), R is hydrogen, methyl or ethyl, and preferably hydrogen. R' is hydrogen or an alkyl group having 1 to 4 carbon atoms. Examples of R' include methyl group, ethyl group, propyl group, isopropyl group, butyl group, isobutyl group and tert-butyl group. The preferred R' is hydrogen, methyl or tert-butyl group. The letter m is an integer of 1 to 4. When m is from 1 to 4, the epoxy resin composition has a fully high Tg and good fluidity. For improving reliability against moisture, it is desirable that the content of alkali metals, alkaline earth metals, halides and other ionic impurities in the epoxy resins be as low as possible.

A mixture of at least two of the phenolic resins of formula (1) wherein m is an integer of 1 to 4, in any desired ratio is also useful as the polyfunctional phenolic resin (B).

In the practice of the invention, another phenolic resin may be used in combination with the polyfunctional phenolic resin of formula (1). Exemplary other phenolic resins include novolac type phenol resins such as phenol novolac resins and cresol novolac resins, bisphenol resins, p-xylylene-modified phenolic resins, m-xylylene-modified phenolic resins, o-xylylene-modified phenolic resins, naphthalene type phenolic resins, biphenyl type phenol resins, aralkyl type phenol resins, and dicyclopentadiene-modified phenolic resins. However, it is desired that the polyfunctional phenolic resin of formula (1) account for at least 70% (i.e., 70 to 100%) by weight of the entire phenolic resin curing agents. If the other phenolic resin(s) exceeds 30% by weight of the curing agent, Tg would become lower and the BGA warpage would increase.

The phenolic resin curing agent is preferably blended with the crystalline epoxy resin such that the molar ratio of phenolic hydroxyl groups in the phenolic resin curing agent to entire epoxy groups in the crystalline epoxy resin may range usually from about 0.6/1 to 1.5/1, preferably from 0.8/1 to 1.2/1 and especially from 0.9/1 to 1.1/1. If this molar ratio is less than 0.6 or more than 1.5, the epoxy resin composition would cure short, resulting in products with poor properties.

The curing accelerator (C) is an organic phosphorus compound. Examples of the organic phosphorus compound curing accelerators include triorganophosphines such as triphenylphosphine, tributylphosphine, tri(p-methylphenyl)phosphine and tri(nonylphenyl)phosphine, salts of triorganophosphines and triorganoboranes such as triphenylphosphine.triphenylborane, salts of tetraorganophosphoniums and tetraorganoborates such as tetraphenylphosphonium.tetraphenylborate. Among them, preferred is a compound having the following general formula (6).

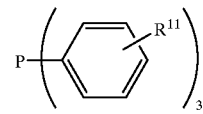

(6)

$R^{11}$ is hydrogen or an alkyl group of 1 to 4 carbon atoms. Examples of $R^{11}$ include methyl group, ethyl group, propyl group, isopropyl group, butyl group, isobutyl group and tert-butyl group. The preferred $R^{11}$ is hydrogen or methyl group.

Illustrative examples of the organic phosphorus compound include triphenylphosphine, tris-o-tolylphosphine, tris-m-tolylphosphine, and tris-p-tolylphosphine. Of these, tristolylphosphine, especially tris-p-tolylphosphine is the preferred curing accelerator because of fast curing and shelf stability. The fast curing advantageously leads to a shorter cycle time of molding and a reduced package warp.

The amount of the curing accelerator is not critical although the amount is preferably 0.0005 to 0.1 mol, especially 0.001 to 0.05 mol, and 0.1 to 20 parts by weight, especially 0.2 to 10 parts by weight per 100 parts by weight of the epoxy resin and curing agent (i.e., phenolic resin) combined. On this basis, a lower amount of the curing accelerator would fail to induce full curing reaction and exacerbate mold release. A higher amount of the curing accelerator would increase the viscosity of the composition upon molding and exacerbate reliability in terms of moisture resistance.

The above-exemplified curing accelerators may be used alone or in admixture of two or more and optionally, in combination with any well-known curing accelerator such as tertiary amine compounds including cycloamidine compounds, and imidazole compounds. In order to facilitate the dispersion of the curing accelerator in the resin composition, the curing accelerator may be premixed with the resin component (i.e., epoxy resin and/or phenolic resin), which is ground.

Component (D) is an aminosilane coupling agent. It is preferably an amino-functional alkoxysilane of the following general formula (7) or a partial hydrolytic condensate thereof or both.

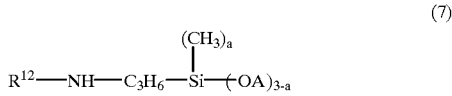

(7)

A is —CH$_3$ or —C$_2$H$_5$, R$^{12}$ is hydrogen, —C$_2$H$_4$NH$_2$ or —C$_6$H$_5$, and a is equal to 0 or 1.

Illustrative examples of the aminosilane coupling agent are compounds of the following structure.

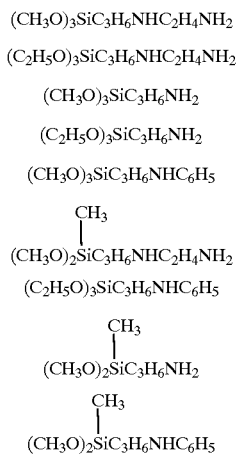

The aminosilane coupling agent (D) may be one or more of the above-mentioned amino-functional alkoxysilane compounds, one or more of partial hydrolytic condensates of these silane compounds, or a mixture of such a silane compound(s) and a partial hydrolytic condensate(s) in any desired ratio.

In a system comprising a crystalline epoxy resin and a polyfunctional phenolic resin as defined above wherein an inorganic filler such as silica is blended in an amount of 88% by weight or more, if a well-known epoxy coupling agent is added, the resulting epoxy resin composition becomes viscous and less flowing and thus causes gold wire flow. In contrast, the use of an aminosilane coupling agent in this system leads to a low viscosity. Of these coupling agents, (CH$_3$O)$_3$SiC$_3$H$_6$NHC$_6$H$_5$ is most desirable.

The aminosilane coupling agent is well dispersible in the resin composition because it has a high affinity to the crystalline epoxy resin and the polyfunctional phenolic resin curing agent in the epoxy resin composition and to organic components such as solder masks and inorganic components such as silica surface on BGA substrates. Therefore, the aminosilane coupling agent is effective for improving the wettability of the organic resin to the inorganic filler, the fluidity of the resin composition, the bonding force at the interface between the organic resin and the inorganic filler, and the bonding force between the resin composition and the solder mask. Owing to these advantages, the resin composition can be reduced in viscosity so as to prevent wire flow, and the improved bonding forces ensure an improvement in reliability upon solder dipping.

The amount of the aminosilane coupling agent added is not critical although the amount is usually 0.1 to 5 parts, preferably 0.2 to 3 parts, and especially 0.5 to 1.5 parts by weight per 100 parts by weight of the epoxy resin and curing agent combined.

The aminosilane coupling agent may be used in combination with another type of coupling agent. Such combined use is often preferable in consideration of a balance with other desired properties. For combined use, the aminosilane coupling agent preferably account for at least 30% (i.e., 30 to 100%) by weight, and more preferably at least 50% (i.e., 50 to 100%) by weight of the entire coupling agents.

Component (E) is an inorganic filler, which may be selected from among fused silica, crystalline silica, alumina, aluminum nitride, and antimony trioxide, for example. The mean particle size of the inorganic filler is not limited, although the fine powdery inorganic filler having a mean particle size of 0.1 to 40 μm, especially 0.3 to 20 μm is preferably used. The mean particle size may be determined as the weight average value (median diameter) using a particle size distribution measurement apparatus based on the laser light diffraction technique. Fillers in spherical form are preferred for fluidity.

The inorganic filler is added in an amount of at least 88%, usually 88 to 94% by weight based on the overall weight of the epoxy resin composition. A more appropriate amount is 90 to 92% and especially 90.1 to 91.0% by weight of the entire epoxy resin composition, because a high fluidity is maintained and the expansion of a cured product is reduced. Loading the composition with less than 88% by weight of the inorganic filler results in a cured product having a greater expansion coefficient, causing greater warpage of the package.

The inorganic filler may have been surface treated with silane coupling agents. The silane coupling agents used for the pretreatment of the inorganic filler include the above-mentioned aminosilane coupling agents as well as silane coupling agents such as epoxy-functional alkoxysilanes and mercapto-functional alkoxysilanes. Preferably the inorganic filler is surface treated with the aminosilane coupling agent. For the surface treatment, the silane coupling agent is preferably used in an amount of 0.1 to 0.8%, more preferably 0.2 to 0.4% by weight based on the total weight of the inorganic filler(s) because this range of surface treatment is effective for improving the wettability of the organic resin to the inorganic filler, the fluidity of the resin composition, and the bonding force at the interface between the organic resin and the inorganic filler like an integral blend. Owing to these advantages, the resin composition can be reduced in viscosity so as to prevent wire flow, and the improved bonding forces ensure an improvement in reliability upon solder dipping.

When the aminosilane coupling agent is used for the surface treatment of the inorganic filler, the amount of this aminosilane coupling agent is considered independent of the amount of the aminosilane coupling agent (D) blended in the composition. This is because the inorganic filler (E) is pretreated with this aminosilane coupling agent before the inorganic filler (E) is mixed with the remaining components (A) to (D).

In addition to the essential components (A) to (E) mentioned above, the epoxy resin composition of the invention may contain additives, for example, coloring agents such as carbon black, flame retardants such as brominated epoxy resins, and stress-reducing agents such as silicone oil, silicone rubber, and copolymers of aromatic resins such as epoxy resins and phenolic resins and organopolysiloxanes, if desired.

The epoxy resin composition can be prepared as a molding material by mixing the epoxy resin, phenolic resin curing agent, inorganic filler, curing accelerator and other additives in a mixer at room temperature, working the mixture in a common kneader such as a roll mill or extruder, followed by cooling and grinding.

To prevent wire flow, the composition should desirably have a melt viscosity of up to 200 poise, and more desirably up to 180 poise as measured at 175° C.

With the epoxy resin composition of the invention, any desired semiconductor device may be encapsulated. The composition is best suited for BGA encapsulation. The molding method used may be any of well-known methods and the molding temperature is usually 160 to 180° C.

EXAMPLE

Examples of the invention are given below by way of illustration and not by way of limitation. All parts are by weight.

Examples 1–9 and Comparative Examples 1–8

Epoxy resin compositions for semiconductor encapsulation were prepared by uniformly melt mixing the components shown in Tables 1 and 2 in a hot two-roll mill, followed by cooling and grinding. The epoxy resin, phenolic resin curing agent, curing accelerator and silane coupling agent used have the following structure.

Crystalline epoxy resin 1

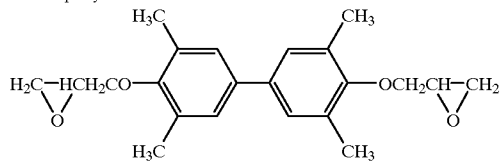

Crystalline epoxy resin 2

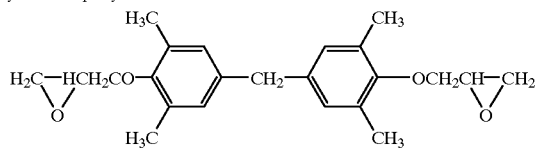

Crystalline epoxy resin 3

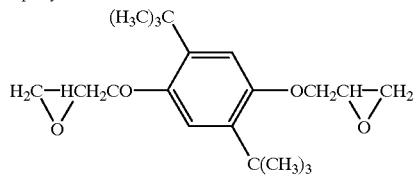

Crystalline epoxy resin 4

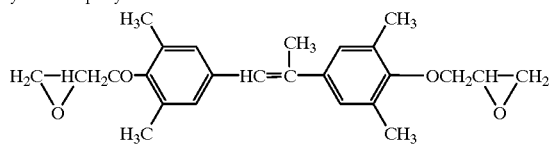

Non-crystalline polyfunctional epoxy resin

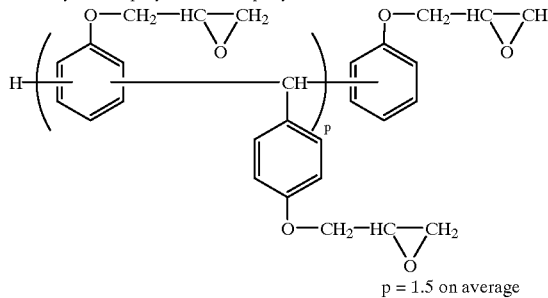

p = 1.5 on average

Polyfunctional phenolic resin curing agent

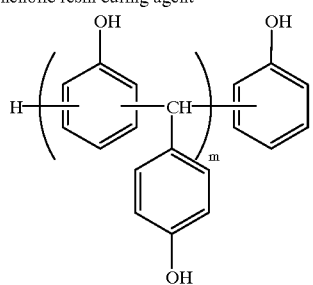

m = 1.2 on average

Phenolic novolac resin curing agent

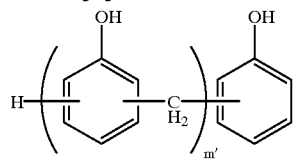

m' = 4.1 on average

Organic phosphorus curing accelerator 1

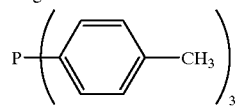

Organic phosphorus curing accelerator 2

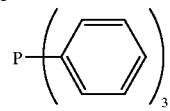

Imidazole curing accelerator

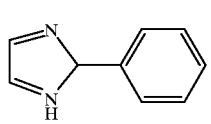

Aminosilane coupling agent 1
$(CH_3O)_3SiC_3H_6NHC_6H_5$
Aminosilane coupling agent 2
$(CH_3O)_3SiC_3H_6NHC_2H_4NH_2$
Aminosilane coupling agent 3
$(CH_3)_3SiC_3H_6NH_2$
Epoxysilane coupling agent

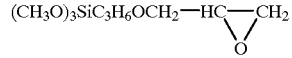

Mercaptosilane coupling agent
$(CH_3O)_3SiC_3H_6SH$

Properties (1) to (10) below were measured for each of these epoxy resin compositions. The results are presented in Tables 1 and 2.

(1) Spiral Flow

The spiral flow was measured by molding each composition in a mold in accordance with EMMI standards at a temperature of 175° C. and a pressure of 70 kgf/mm² and for a time of 90 seconds.

(2) Gel Time

The gel time for each composition was measured on a hot plate at 175° C.

(3) Melt Viscosity

The melt viscosity was measured at 175° C. using a constant-load, orifice-type flow testing apparatus of the kind known in Japan as a Koka-type flow tester (Shimazu Mfg. K.K.)

(4) Hardness When Hot

In accordance with JIS K-6944, each composition was molded and cured at 175° C. and 70 kgf/mm$^2$ for a time of 60 seconds into a part with dimensions of 4×10×100 mm, which was measured for hardness when hot using a Barcol Impressor.

(5) Glass Transition Temperature (Tg) and Linear Expansion Coefficient ($\alpha 1$ and $\alpha 2$)

Test specimens with dimensions of 5×5×15 mm were obtained by molding each composition at 175° C. and 70 kgf/mm$^2$ for a time of 90 seconds and post-curing at 180° C. for 4 hours. Measurement of both properties was carried out by raising the temperature of the test specimen at a rate of 5° C./min in a dilatometer.

(6) Shelf Stability

The epoxy resin composition was placed in a sealed aluminum pouch and left to stand at 25° C. for 72 hours in a constant-temperature chamber. The spiral flow of the aged composition was measured as in (1) above, and a percentage decrease in the aged value relative to the initial value was calculated.

(7) Package Warpage

On a substrate of 35×35×0.5 mm, the epoxy resin composition was molded at 175° C. and 70 kgf/mm$^2$ for a time of 90 seconds to form a test sample of 32×32×1.2 mm. The amount of warping on the molded resin side of the package was then measured using a laser-type undulation tester (Yasunaga K.K.). After 4 hours of post-curing at 180° C., measurement was repeated again. An average of eight samples was reported.

(8) Adhesion to Substrate

By molding the epoxy composition at 175° C. and 70 kgf/mm$^2$ for a time of 90 seconds and post-curing at 180° C. for 4 hours, an adhesion test specimen of frusto-conical shape was formed on a PSR400AUS5-coated BT substrate (The bottom of the specimen bonded to the substrate had an area of 10 mm$^2$). The specimen was subjected to two deteriorating cycles each consisting of keeping at 85° C. and RH 85% for 72 hours, followed by IR reflow soldering. The shear bond strength was measured at a shear rate of 1 mm/sec using a push-pull gauge. An average of eight samples was reported.

(9) Water Absorption

The epoxy resin composition was molded at 175° C. and 70 kgf/mm$^2$ for a time of 90 seconds into a disk having a diameter of 50 mm and a thickness of 3 mm. It was post cured at 180° C. for 4 hours. The weight of the disk was measured. The disk was allowed to stand under hot humid conditions of 85° C. and RH 85% for 168 hours and its weight was measured again. A weight change from the initial weight is reported as a percent water absorption.

(10) Flame Retardance

The epoxy resin composition was molded at 175° C. and 70 kgf/mm$^2$ for a time of 90 seconds into 13×127 mm size strips of ⅛ inch and 1/16 inch thick. The strips were post cured at 180° C. for 4 hours before they were examined for flame retardance in accordance with UL 94 test specifications, rating V-0.

TABLE 1

| Composition (pbw) | E1 | E2 | E3 | E4 | E5 | E6 | E7 | E8 | E9 |
|---|---|---|---|---|---|---|---|---|---|
| Crystalline epoxy resin 1 | 59.0 | — | — | — | 59.0 | — | 59.0 | 59.0 | 59.0 |
| Crystalline epoxy resin 2 | — | 59.3 | — | — | — | — | — | — | — |
| Crystalline epoxy resin 3 | — | — | 57.4 | — | — | — | — | — | — |
| Crystalline epoxy resin 4 | — | — | — | 55.3 | — | 55.3 | — | — | — |
| Non-crystalline polyfunctional epoxy resin | — | — | — | — | — | — | — | — | — |
| Brominated phenol novolac epoxy resin | 8.0 | 8.0 | 8.0 | 8.0 | 8.0 | 8.0 | 8.0 | 8.0 | 8.0 |
| Polyfunctional phenolic resin curing agent | 33.0 | 32.7 | 34.6 | 36.7 | 33.0 | 36.7 | 33.0 | 33.0 | 33.0 |
| Phenol novolac resin curing agent | — | — | — | — | — | — | — | — | — |
| Organic phosphorus curing accelerator 1 | 1.2 | 1.2 | 1.2 | 1.2 | — | — | 1.2 | 1.2 | 1.2 |
| Organic phosphorus curing accelerator 2 | — | — | — | — | 1.5 | 1.5 | — | — | — |
| Imidazole curing accelerator | — | — | — | — | — | — | — | — | — |
| Aminosilane coupling agent 1 | 0.5 | 0.5 | 0.5 | 0.5 | 0.5 | 0.5 | 1.0 | — | — |
| Aminosilane coupling agent 2 | — | — | — | — | — | — | — | 0.5 | — |
| Aminosilane coupling agent 3 | — | — | — | — | — | — | — | — | 0.5 |
| Epoxysilane coupling agent | — | — | — | — | — | — | — | — | — |
| Mercaptosilane coupling agent | 0.5 | 0.5 | 0.5 | 0.5 | 0.5 | 0.5 | 0.5 | 0.5 | 0.5 |
| Spherical silica (mean particle size 15 μm) | 1000 | 1000 | 1000 | 1000 | 1000 | 1000 | 1000 | 1000 | 1000 |
| Carbon black | 3 | 3 | 3 | 3 | 3 | 3 | 3 | 3 | 3 |
| Antimony trioxide | 5 | 5 | 5 | 5 | 5 | 5 | 5 | 5 | 5 |
| Carnauba wax | 3 | 3 | 3 | 3 | 3 | 3 | 3 | 3 | 3 |
| Inorganic filler content in composition (wt %) | 90.3 | 90.3 | 90.3 | 90.3 | 90.3 | 90.3 | 90.2 | 90.3 | 90.3 |
| Spiral flow (inch) | 40 | 44 | 48 | 37 | 42 | 30 | 41 | 45 | 43 |
| Gel time (sec) | 24 | 22 | 25 | 26 | 25 | 23 | 25 | 23 | 24 |
| Melt viscosity (poise) | 110 | 130 | 90 | 120 | 130 | 160 | 100 | 120 | 110 |
| Hardness when hot | 88 | 87 | 91 | 90 | 87 | 88 | 85 | 86 | 87 |
| Tg (° C.) | 171 | 174 | 178 | 170 | 165 | 160 | 163 | 160 | 162 |
| $\alpha 1$ ($10^{-5}$/° C.) | 0.8 | 0.8 | 0.8 | 0.8 | 0.8 | 0.8 | 0.8 | 0.8 | 0.8 |

TABLE 1-continued

| Composition (pbw) | E1 | E2 | E3 | E4 | E5 | E6 | E7 | E8 | E9 |
|---|---|---|---|---|---|---|---|---|---|
| α2 (10$^{-5}$/° C.) | 2.7 | 2.9 | 2.8 | 2.9 | 2.9 | 3 | 2.9 | 3.1 | 2.9 |
| Shelf stability (%) | 90 | 91 | 89 | 90 | 88 | 89 | 89 | 90 | 89 |
| Package warpage (μm) | 11 | 15 | 9 | 10 | 25 | 20 | 20 | 16 | 15 |
| Substrate adhesion (kgf) | 7.5 | 8.2 | 7.5 | 8.5 | 7.5 | 7 | 8.5 | 8.2 | 8.3 |
| Water absorption (wt %) | 0.23 | 0.22 | 0.23 | 0.21 | 0.24 | 0.23 | 0.24 | 0.23 | 0.23 |
| Flame retardance | V-0 | V-0 | V-0 | V-0 | V-0 | V-0 | V-0 | V-0 | V-0 |

TABLE 2

| Composition (pbw) | CE1 | CE2 | CE3 | CE4 | CE5 | CE6 | CE7 | CE8 |
|---|---|---|---|---|---|---|---|---|
| Crystalline epoxy resin 1 | — | — | 59.0 | 59.0 | 59.0 | 56.2 | 59.0 | 59.0 |
| Crystalline epoxy resin 2 | — | — | — | — | — | — | — | — |
| Crystalline epoxy resin 3 | — | — | — | — | — | — | — | — |
| Crystalline epoxy resin 4 | — | — | — | — | — | — | — | — |
| Non-crystalline polyfunctional epoxy resin | 57.2 | 57.2 | — | — | — | — | — | — |
| Brominated phenol novolac epoxy resin | 8.0 | 8.0 | 8.0 | 8.0 | 8.0 | 8.0 | 8.0 | 8.0 |
| Polyfunctional phenolic resin curing agent | 32.4 | 32.4 | 33.0 | 33.0 | 33.0 | — | 33.0 | 33.0 |
| Phenol novolac resin curing agent | — | — | — | — | — | 35.8 | — | — |
| Organic phosphorus curing accelerator 1 | 0.8 | — | — | 1.2 | 1.2 | 1.2 | 1.2 | 1.2 |
| Organic phosphorus curing accelerator 2 | — | — | — | — | — | — | — | — |
| Imidazole curing accelerator | — | 0.8 | 0.8 | — | — | — | — | — |
| Aminosilane coupling agent 1 | 0.5 | 0.5 | 0.5 | — | 0.5 | 0.5 | — | — |
| Aminosilane coupling agent 2 | — | — | — | — | — | — | — | — |
| Aminosilane coupling agent 3 | — | — | — | — | — | — | — | — |
| Epoxysilane coupling agent | — | — | — | 1.0 | — | — | 1.0 | — |
| Mercaptosilane coupling agent | 0.5 | 0.5 | 0.5 | 0.5 | 0.5 | 0.5 | — | 0.5 |
| Spherical silica (mean particle size 15 μm) | 1000 | 1000 | 1000 | 1000 | 700 | 1000 | 1000 | 1000 |
| Carbon black | 3 | 3 | 3 | 3 | 3 | 3 | 3 | 3 |
| Antimony trioxide | 5 | 5 | 5 | 5 | 5 | 5 | 5 | 5 |
| Carnauba wax | 3 | 3 | 3 | 3 | 3 | 3 | 3 | 3 |
| Inorganic filler content in composition (wt %) | 90.5 | 90.5 | 90.3 | 90.2 | 86.6 | 90.3 | 90.3 | 90.3 |
| Spiral flow (inch) | 20 | 23 | 35 | 33 | 56 | 37 | 30 | 28 |
| Gel time (sec) | 18 | 15 | 18 | 20 | 26 | 25 | 20 | 21 |
| Melt viscosity (poise) | 470 | 430 | 250 | 220 | 80 | 160 | 310 | 300 |
| Hardness when hot | 91 | 93 | 90 | 86 | 80 | 83 | 85 | 85 |
| Tg (° C.) | 195 | 200 | 178 | 170 | 168 | 158 | 171 | 175 |
| α1 (10$^{-5}$/° C.) | 1.0 | 0.9 | 0.9 | 0.8 | 1.4 | 0.9 | 0.8 | 0.8 |
| α2 (10$^{-5}$/° C.) | 3.7 | 3.3 | 3 | 3.5 | 4.8 | 2.9 | 3.7 | 3.6 |
| Shelf stability (%) | 89 | 69 | 60 | 90 | 90 | 89 | 85 | 84 |
| Package warpage (μm) | 46 | 40 | 35 | 39 | 150 | 120 | 46 | 50 |
| Substrate adhesion (kgf) | 6.8 | 7.1 | 7.5 | 8.1 | 7.6 | 7.8 | 6.8 | 5.6 |
| Water absorption (wt %) | 0.38 | 0.45 | 0.28 | 0.27 | 0.41 | 0.28 | 0.38 | 0.39 |
| Flame retardance | V-0 | V-0 | V-0 | V-0 | V-0 | V-0 | V-0 | V-0 |

Epoxy resin compositions containing a crystalline epoxy resin, polyfunctional phenolic resin curing agent, organic phosphorus curing accelerator, aminosilane coupling agent and more than 88% by weight of an inorganic filler within the scope of the invention are smoothly flowing, fast curing, and storage stable. They have a high Tg, a smaller coefficient of expansion, a reduced warpage of BGA packages, good adhesion to solder masks, and low water absorption. Because of the high loading of inorganic filler, a satisfactory level of flame retardance is accomplished without resorting to flame retardants such as brominated phenol novolac resins or flame retarding assistants such as antimony trioxide. Therefore, semiconductor devices encapsulated with the epoxy resin compositions within the scope of the invention are resistant to crack during reflow soldering and highly reliable.

Japanese Patent Application No. 10-221074 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A semiconductor-encapsulating epoxy resin composition comprising (A) a crystalline epoxy resin, (B) a polyfunctional phenolic resin of the following general formula (1):

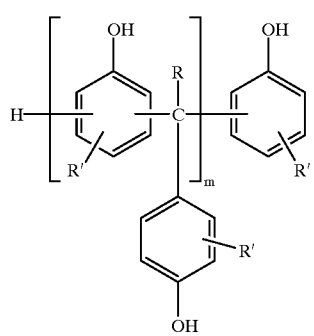
(1)

wherein R is hydrogen, methyl or ethyl, R' is hydrogen or an alkyl group having 1 to 4 carbon atoms, and m is an integer of 1 to 4, (C) an organic phosphorus curing accelerator,
(D) an aminosilane coupling agent, and
(E) at least 88% by weight based on the composition of an inorganic filler.

2. The epoxy resin composition of claim 1 wherein the crystalline epoxy resin (A) is of the following general formulae (2) to (5):

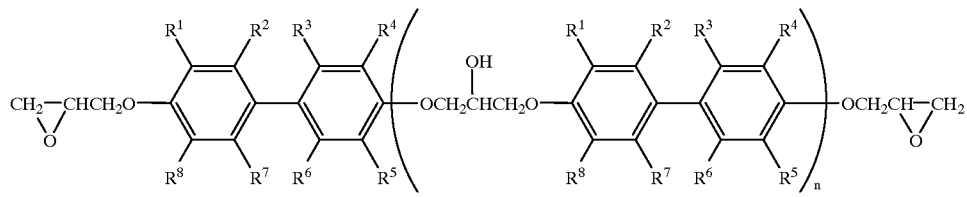
(2)

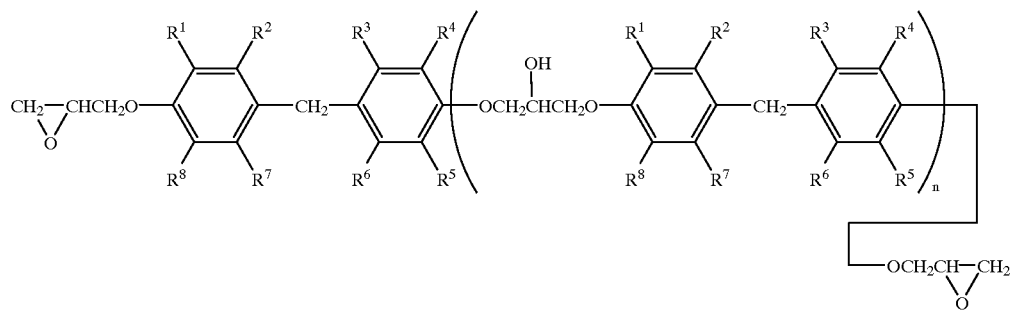
(3)

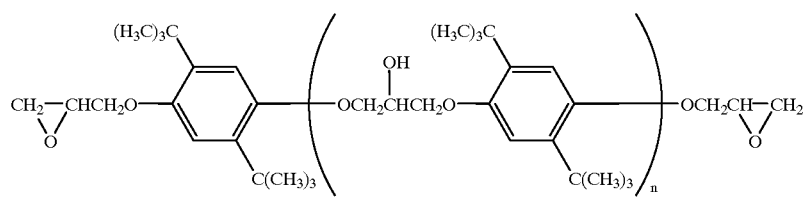
(4)

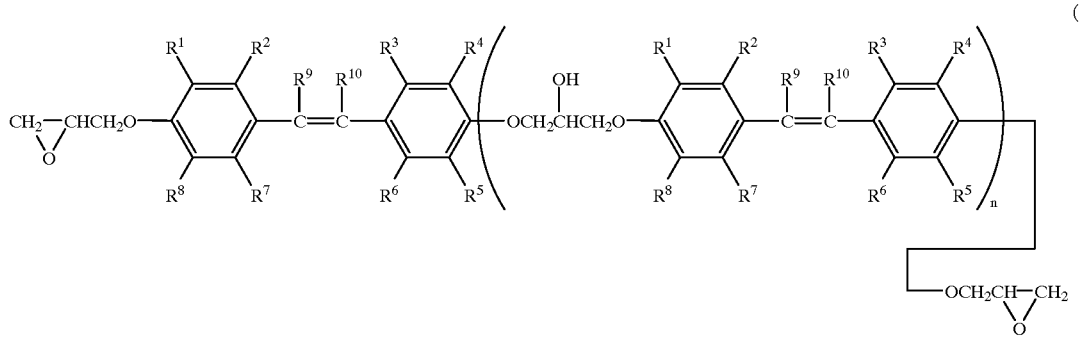
(5)

wherein $R^1$ to $R^8$ in formulae (2) to (4) are independently selected from the group consisting of hydrogen and alkyl groups of 1 to 4 carbon atoms, $R^1$ to $R^{10}$ in formula (5) are independently selected from the group consisting of hydro gen and alkyl groups of 1 to 6 carbon atoms, and n is an integer of 0 to 4.

3. The epoxy resin composition of claim 1 wherein the organic phosphorus curing accelerator (C) is of the following general formula (6):

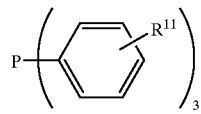
(6)

wherein $R^{11}$ is hydrogen or an alkyl group of 1 to 4 carbon atoms.

4. The epoxy resin composition of claim 1 wherein the aminosilane coupling agent (D) is an amino-functional alkoxysilane of the following general formula (7):

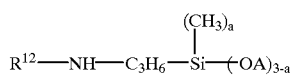
(7)

wherein A is $—CH_3$ or $—C_2H_5$, $R^{12}$ is hydrogen, $—C_2H_4NH_2$ or $—C_6H_5$, and a is equal to 0 or 1, or a partial hydrolytic condensate thereof or both.

5. A semiconductor device encapsulated with the epoxy resin composition of claim 1 in a cured state.

6. The encapsulated semiconductor device of claim 5, wherein said device is a ball grid array.

7. The epoxy resin composition of claim 1 wherein, in component (B), R is hydrogen, R' is hydrogen, and m averages 1.2.

8. The epoxy resin composition of claim 4, wherein the aminosilane coupling agent is selected from the group consisting of $(CH_3O)_3SiC_3H_6NHC_6H_5$, $(CH_3O)_3SiC_3H_6NHC_2H_4NH_2$, and $(CH_3O)_3SiC_3H_6NH_2$.

9. The epoxy resin composition of claim 1, wherein said inorganic filler is selected from the group consisting of fused silica, crystalline silica, alumina, aluminum nitride, and antimony trioxide.

10. The epoxy resin composition of claim 1, wherein said inorganic filler is present in an amount of 90 to 92% by weight based on the overall weight of the epoxy resin composition.

* * * * *